(12) United States Patent
Kim

(10) Patent No.: US 9,087,956 B2
(45) Date of Patent: Jul. 21, 2015

(54) SOLAR CELL AND FABRICATION METHOD THEREOF

(75) Inventor: Jong-Hwan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 915 days.

(21) Appl. No.: 12/560,515

(22) Filed: Sep. 16, 2009

(65) Prior Publication Data

US 2010/0243040 A1 Sep. 30, 2010

(30) Foreign Application Priority Data

Mar. 25, 2009 (KR) ........................ 10-2009-0025462

(51) Int. Cl.
H01L 31/0224 (2006.01)
H01L 31/18 (2006.01)
H01L 31/068 (2012.01)
H01L 31/0216 (2014.01)

(52) U.S. Cl.
CPC ...... H01L 31/1804 (2013.01); H01L 31/02245 (2013.01); H01L 31/068 (2013.01); H01L 31/0684 (2013.01); H01L 31/02168 (2013.01); H01L 31/022458 (2013.01); H01L 31/0682 (2013.01); Y02E 10/52 (2013.01); Y02E 10/547 (2013.01)

(58) Field of Classification Search
CPC .............. H01L 31/02245; H01L 31/022458; H01L 31/1804; H01L 31/068; H01L 31/0682; H01L 31/0684; H01L 31/02168; Y02E 10/547; Y02E 10/52

USPC .................................... 136/255, 256
See application file for complete search history.

(56) References Cited

U.S. PATENT DOCUMENTS

| | | | |
|---|---|---|---|
| 5,421,908 A * | 6/1995 | Yoshida et al. | 136/244 |
| 6,384,317 B1 * | 5/2002 | Kerschaver et al. | 136/256 |
| 7,170,001 B2 * | 1/2007 | Gee et al. | 136/256 |
| 2002/0153039 A1 * | 10/2002 | Moon et al. | 136/256 |
| 2004/0112426 A1 * | 6/2004 | Hagino | 136/261 |
| 2004/0261840 A1 | 12/2004 | Schmit et al. | |
| 2005/0172996 A1 | 8/2005 | Hacke et al. | |
| 2005/0176164 A1 * | 8/2005 | Gee et al. | 438/48 |
| 2006/0162766 A1 * | 7/2006 | Gee et al. | 136/256 |
| 2007/0235075 A1 | 10/2007 | Park | |
| 2009/0071540 A1 * | 3/2009 | Klein et al. | 136/261 |
| 2009/0272419 A1 * | 11/2009 | Sakamoto et al. | 136/244 |
| 2011/0005582 A1 * | 1/2011 | Szlufcik et al. | 136/252 |

FOREIGN PATENT DOCUMENTS

JP 2007-281447 A 10/2007
KR 10-2008-0032866 A 4/2008

* cited by examiner

*Primary Examiner* — Matthew Martin
(74) *Attorney, Agent, or Firm* — Birch, Stewart, Kolasch & Birch, LLP

(57) ABSTRACT

Disclosed are a metal wrap through solar cell including a metal wrap through (MWT) structure as a back contact silicon solar cell and a fabrication method thereof.

19 Claims, 2 Drawing Sheets

SOLAR CELL AND FABRICATION METHOD THEREOF

This application claims priority to Korean Patent Application No. 10-2009-0025462, filed on Mar. 25, 2009, in the Korean Intellectual Property Office, the entire contents of which are hereby incorporated by reference.

BACKGROUND OF THE INVENTION

1. Field of the Invention

The present invention relates to a solar cell and a fabrication method thereof, and in particular, to a metal wrap through solar cell including a metal wrap through (MWT) structure as a back contact silicon solar cell and a fabrication method thereof. More specifically, the present invention relates to a solar cell capable of increasing the efficiency of a solar cell by leaving only a metal finger line on a front surface of the solar cell and installing a metal electrode on a rear surface of a semiconductor substrate by penetrating through the semiconductor substrate, instead of a solar cell wherein a bus bar electrode is formed on a front surface of a solar cell according to the related art, and a fabrication method thereof.

2. Description of the Related Art

In recent years, new forms of renewable energy are of much interest due to problems, such as rising oil prices, global warming, exhaustion of fossil energy, nuclear waste disposal, position selection involved in construction of a new power plant and the like. Among others, research and development into solar cells, which is a pollution-free energy source, has actively progressed.

A solar cell, which is an apparatus converting light energy into electric energy using a photovoltaic effect, may be typed as a silicon solar cell, a thin film solar cell, a dye-sensitized solar cell, an organic polymer solar sell, and the like according to their constituent materials. The solar cell is independently used as a main power supply for an electronic clock, a radio, an unmanned lighthouse, an artificial satellite, a rocket, and the like and as an auxiliary power supply by being connected to a commercial alternating power supply. Recently, there is much growing interest into solar cells due to an increased need of alternate energy.

A solar cell to generate electricity using sunlight has generally been manufactured using silicon. Currently commercialized bulk silicon solar cells have not entered into widespread use due to high manufacturing costs and installation costs. In order to solve such problems related to the cost, research into a slim type solar cell using silicon has actively progressed and various attempts to manufacture a high efficiency solar cell module have been made.

SUMMARY OF THE INVENTION

The present invention relates to a structure and a process of a solar cell to improve the photoelectric conversion efficiency of a crystalline silicon solar cell as described above. In particular, it is an object of the present invention to provide a structure of a solar cell capable of improving light trapping capability, reducing contact resistance, and suppressing a recombination rate of excited pairs of electrons and holes, and fabrication method thereof.

It is another object of the present invention to provide a high-efficiency solar cell with an increased open circuit voltage, short circuit current, and fill factor (F.F.) value as a shadowing phenomenon due to an electrode is reduced by improving an electrode structure of a front surface portion on which light is incident.

In order to achieve the objects, there is provided a solar cell according to one embodiment of the present invention, comprising: a semiconductor substrate; an emitter layer that is formed on the front surface and side surface of the semiconductor substrate; a passivation layer that is formed on the rear surface of the semiconductor substrate; a rear electrode that contacts the semiconductor substrate through the passivation layer; at least one back surface field (BSF) layer that is formed in an region where the rear electrode contacts the semiconductor substrate; and a metal electrode including a finger part that is formed on the front surface of the semiconductor substrate, a penetration part that penetrates through the emitter layer, the semiconductor substrate, and the passivation layer, and a bus bar that is spaced from the back surface field layer and is formed on the rear surface of the semiconductor substrate.

In the present invention, the semiconductor substrate may be a p-type semiconductor substrate, the emitter layer may be an n-type semiconductor dopant doping layer, and the back surface field layer may be a p+ type semiconductor dopant doping layer that is doped with a concentration higher than a p-type semiconductor dopant doped on the semiconductor substrate, and vice versa.

In the semiconductor substrate, each of the pairs of electrons and holes is excited due to the incidence of sunlight and is separated from each other and then moves to the emitter layer and the back surface field layer. The semiconductor substrate has a structure that collects charges through the metal electrode and the rear electrode, respectively. According to the present invention, the semiconductor substrate has an electrode structure that collects charges to the rear surface portion while increasing a light receiving region by minimizing an electrode surface that leads to the shadowing phenomenon of the front surface portion, such that it can improve handling, efficiency, and reliability.

The metal electrode and the rear electrode functions as an anode electrode, or a cathode electrode, respectively, according to the conductive type of the semiconductor substrate, the emitter layer, and the back surface field layer.

In the present invention, the upper portion of the metal electrode may be a finger portion and can be exposed to the front surface of the semiconductor substrate in a finger line form. However, this form is not limited thereto and can be changed in various forms.

In the present invention, the width of the finger part of the metal electrode is preferably narrower than that of the penetration part or that of the bus bar. However, the width of the finger par of the metal electrode is equal to or slightly wider than that of the penetration part, if necessary. Even in this case, the width of the finger part is preferably narrower than that of the bus bar.

Further, in the present invention, the width of the bus bar of the metal electrode is wider than that of the penetration part.

Further, the height of the finger part of the metal electrode may be shorter than that of the bus bar of the metal electrode. However, this limitation is one embodiment and is not necessarily limited thereto.

In the present invention, the metal electrode, which penetrates through the emitter layer, the semiconductor substrate, and the passivation layer, may be a shape of a penetration groove whose width is 50 μm to 100 μm, but the numerical value of the width is not necessarily limited thereto.

In the present invention, the emitter layer may be further formed on the rear surface of the semiconductor layer and have a concentration gradient where the doping concentration of semiconductor dopant is increased as moving toward the metal electrode penetrating through the emitter layer.

In other words, the emitter layer, which is an adjacent region to the metal electrode penetrating through the emitter layer, may be a selective emitter layer that is configured to include a first region doped with high-concentration semiconductor dopant and a second region doped with semiconductor dopant having concentration lower than that of the first region.

As in the present invention, doping the region adjacent to the penetration groove of the metal electrode within the emitter layer facilitates the mobility and collection of charges. Further, as compared to the case where the high-concentration emitter is formed down to a portion in which the metal electrode is not positioned, the high-concentration dopants that exist on the surface excessively exist in the silicon and thus precipitate is formed, such that the lifetime of charges is reduced, making it possible to prevent the operation efficiency of the solar cell from degrading.

In addition, the thickness of the first region in the emitter layer may be thicker than that of the second region and the thickness of each region is not particularly limited but the thickness of the first region may be three times or four times as thick as that of the second region.

In particular, the first region, which is a high-concentration doping region of the selective emitter layer, may be 0.7 μm to 1.0 μm in thickness and the second region, which is a low-concentration doping region, may be 0.1 to 0.2 μm in thickness. However, the thickness is not limited thereto. The first region may be formed at a thickness so that sheet resistance is 20 Ω/sq. or less and the second region may be formed at a thickness so that sheet resistance is higher than 80 Ω/sq. The sheet resistance of the emitter layer of the crystalline silicon solar cell in the related art is formed at a uniform thickness at about 50 Ω/sq. However, the emitter layer of the present invention is divided into the selective doping region, thereby increasing the efficiency.

In the present invention, at least one back surface field layer may be selectively formed at a portion contacting the semiconductor substrate through the contact hole of the passivation layer. At least one back surface field layer formed as described above may be connected to the rear electrode using laser.

The passivation layer may be formed to have at least one contact hole. The back surface field layer contacts the semiconductor substrate through the contact hole, making it possible to more easily attract charges. If the back surface field layer is formed in plurality, these back surface field layers each may be selectively formed on the rear surface portion of the semiconductor substrate, but intermittently formed on each contact hole of the passivation layer, including at least one contact hole.

Since the back surface field layer locally contacts the rear surface of the semiconductor substrate, the recombination speed of electrons and holes at the corresponding portion is reduced, making it possible to increase the efficiency of the solar cell. In other words, charges formed due to the local contact can be better attracted so as to be extracted outside.

The passivation layer of the present invention may compose of at least any one selected from a group consisting of silicon oxide ($SiO_2$), silicon nitride (SiNx), and silicon oxinitride ($SiO_xN_y$), but is not limited thereto. As a result, as the materials for the passivation layer, known dielectric materials that can prevent the modification of the silicon wafer substrate can be used.

According to one embodiment of the present invention, at least one antireflection film may be further provided on the upper surface of the emitter layer.

The antireflection film may generally be a single layer composed of silicon nitride (SiNx), but is not limited thereto. As a result, the antireflection film may be composed of SiNx/SiON, SiNx/$SiO_2$, etc. and may be implemented in a multi layer including these material layers. The antireflection film suppresses light incident on a light receiving surface, making it possible to induce effective light trapping. Further, the antireflection film also provides passivation of the silicon semiconductor substrate.

With one embodiment of the present invention, the front surface of the semiconductor substrate or the front surface and rear surface of the semiconductor substrate may be a texturing structure.

The texturing structure means that the surface of the substrate has a monolithic irregular evenness structure, but the characteristics of the form, shape, density, etc., thereof are not particularly limited.

Further, in order to achieve the above objects, there is provided a fabrication method of a crystalline silicon solar cell according to the present invention, comprising the steps of: forming at least one penetration groove that penetrates through the front surface and rear surface of the semiconductor substrate; forming an emitter layer having a polarity different from a polarity of the semiconductor substrate on the semiconductor substrate; forming a passivation layer with or without at least one contact hole on the rear surface of the semiconductor substrate; forming a metal electrode connected via the penetration groove from the front surface of the semiconductor substrate to the rear surface thereof; and forming a rear electrode that locally contacts the semiconductor substrate and is formed on the rear surface of the semiconductor substrate.

The fabrication method of a solar cell according to the present invention further comprises the step of locally forming a back surface field layer at the contacting surface of the rear electrode and the semiconductor substrate.

In the present invention, the metal electrode functions as a cathode or anode electrode according to the conductive type of the semiconductor substrate to collect charges and the rear electrode functions as a conductive electrode opposite to that of the metal electrode to collect charges through the back surface field layer.

With one embodiment of the present invention, the fabrication method may further comprise the step of texturing front surface of the semiconductor substrate and the front surface and the rear surface of the semiconductor substrate before and after forming the penetration groove.

The texturing may be performed by any one of a wet chemical etching method, a dry chemical etching method, an electrochemical etching method, and a mechanical etching method, but is not necessarily limited thereto.

In particular, as the dry etching method, a reactive ion etching (RIE) method can be used and as a mechanical etching method, an etching method using laser can be used.

In the fabrication method of a solar cell of the present invention, the penetration groove may be formed using any one of a laser drilling method, a dry etching method, a wet etching method, a mechanical drilling method, and a water jet machining method.

In the present invention, the step of forming the metal electrode and the step of forming the rear electrode can be performed at the same time or a different time.

The process of performing the forming the metal electrode and the forming the rear electrode at the same time may comprise of applying and drying each metal paste on the penetration grooves of the front surface and rear surface of the semiconductor substrate, applying and drying the same conductive paste as that of the semiconductor substrate on the rear surface of the semiconductor substrate by performing a patterning to be spaced from the metal paste, and heat treating and firing the conductive paste.

In this case, the heat treating and firing is a co-firing process that is performed together after patterning, applying, and drying pastes for forming the metal electrode and paste for forming the rear electrode, respectively.

The process of performing the forming the metal electrode and the forming the rear electrode at a different time may comprise of applying and drying metal paste on the penetration grooves of the front surface and rear surface of the semiconductor substrate, respectively, heat treating and firing the metal paste, applying and drying the same conductive paste as that of the semiconductor substrate on the rear surface of the semiconductor substrate by performing a patterning to be spaced from the metal paste, and heat treating and firing the conductive paste.

This case is a double-firing process that performs the patterning, applying, and drying the paste for forming the metal electrode and the patterning, applying, and drying the paste for forming the rear electrode separately and then performs the heat treating and firing separately.

The metal paste used for forming the metal electrode may be silver (Ag) paste, but is not necessarily limited thereto. As a result, as the materials for the metal paste, known conductive metal materials that can implement the metal electrode can be used.

Further, the paste for forming the rear electrode is not particularly limited, but may preferably be aluminum (Al) paste or aluminum silver (AgAl) paste.

The applying of the paste may be performed by any one of a printing method, a screen printing method, and a deposition method.

The formation of the metal electrode and the rear electrode illustrates patterning and applying the paste, but this may be only one embodiment and is not limited thereto. All the known methods of patterning them at a desired position and forming components can be used.

The heat treating temperature of the firing is not particularly limited. As the heat treating temperature, a temperature that can melt the patterned pastes and inject the melted pastes into the silicon substrate can be used. As one embodiment, the heat treating may be performed at a temperature of 700° to 1200°.

When forming the rear electrode locally contacting the rear surface of the semiconductor substrate, the region of the back surface field layer doped with the same conductive high-concentration dopant as that of the semiconductor substrate may locally contact the semiconductor substrate through the passivation layer by the firing process.

In the present invention, the step of forming the emitter may comprise the steps of: patterning a silicon oxide film on the front surface of the semiconductor substrate including the penetration groove; and forming a first region doped with high-concentration semiconductor dopant by the thermal diffusion of semiconductor dopant having a conductive type opposite to that of the semiconductor substrate and a second region that locally penetrates through the patterned silicon oxide film and doped with semiconductor dopant having lower concentration than that of the first region.

In addition, the fabrication method may further comprise the step of forming at least one antireflection film on the upper portion of the emitter layer.

In the present invention, the passivation layer may be formed by any one of a chemical vapor deposition (CVD) method, a plasma enhanced chemical vapor deposition (PECVD) method, a printing method, and a spray method, but is not necessarily limited thereto. As a result, various known stacking methods can be applied.

According to one embodiment of the present invention, the passivation layer having the contact hole may be formed by forming at least one film composed of at least any one material selected from silicon oxide ($SiO_2$), silicon nitride ($SiN_x$), and silicon oxinitride ($SiO_xN_y$) by any one of a chemical vapor deposition (CVD) method, a plasma enhanced chemical vapor deposition (PECVD) method, a printing method, and a spray method and generating at least one contact hole by removing a portion of the film by a chemical etching method or a mechanical etching method.

The chemical etching method is an etching method using etching solution or paste and the mechanical etching method is an etching method using laser.

The reason for performing the passivation is that charges such as electrons or holes generated when light is incident by inactivating defects at the dangling bond or interface of the exposed silicon wafer substrate disappear at that portion, thereby reducing the recombination probability of charges.

According to one embodiment of the present invention as described above, the method of forming the contact hole by locally exposing the passivation layer using the etching paste or laser, printing and firing the rear electrode thereon, and electrically connecting them is used, but the present invention is not necessarily limited thereto. If necessary, the method of forming the passivation layer without the contact hole, forcibly mixing the rear electrode and a portion of the passivation layer using laser, and electrically connecting the rear electrode and the semiconductor substrate can be used.

According to another embodiment of the present invention, provided is a solar cell, including a semiconductor substrate; an emitter layer that is formed on a front surface and a side surface of the semiconductor substrate; a passivation layer that is formed on a rear surface of the semiconductor substrate; a rear electrode that contacts the semiconductor substrate through the passivation layer; at least one back surface field (BSF) layer that is formed in an region where the rear electrode contacts the semiconductor substrate; and a metal electrode including, a finger part that is formed on the front surface of the semiconductor substrate, a penetration part that contacts the finger part and formed through the emitter layer, the semiconductor substrate, and the passivation layer, and a bus bar that contacts the penetration part, is spaced from the back surface field layer and is formed on the rear surface of the semiconductor substrate.

According to another embodiment of the present invention, provided is fabrication method of a silicon solar cell, the method including forming at least one penetration groove that penetrates through a semiconductor substrate from a front surface to a rear surface of the semiconductor substrate; forming an emitter layer having a polarity different from a polarity of the semiconductor substrate on the semiconductor substrate; forming a passivation layer on the rear surface of the semiconductor substrate; forming a metal electrode in the penetration groove through the semiconductor substrate; and forming a rear electrode that locally contacts the semiconductor substrate through the passivation layer and is formed at the rear surface of the semiconductor substrate.

The solar cell of the present invention can be completed by performing an edge isolation using laser and subjecting to a cell test process and a classifying process after the processes are performed.

With the solar cell and the fabrication method thereof according to the present invention, a solar cell having the excellent light trapping capability, improved contact resistance between metal and silicon, and excellent efficiency while reducing the loss caused by the recombination of electrons and holes can be provided, as compared to a crystalline silicon solar cell according to the related art.

With the solar cell and the fabrication method thereof according to the present invention, a solar cell having the significantly improved photoelectric conversion efficiency by improving the structure of the general solar cell without significantly adding separate processes to the existing processes can be provided with an economical production cost and short production time.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1:
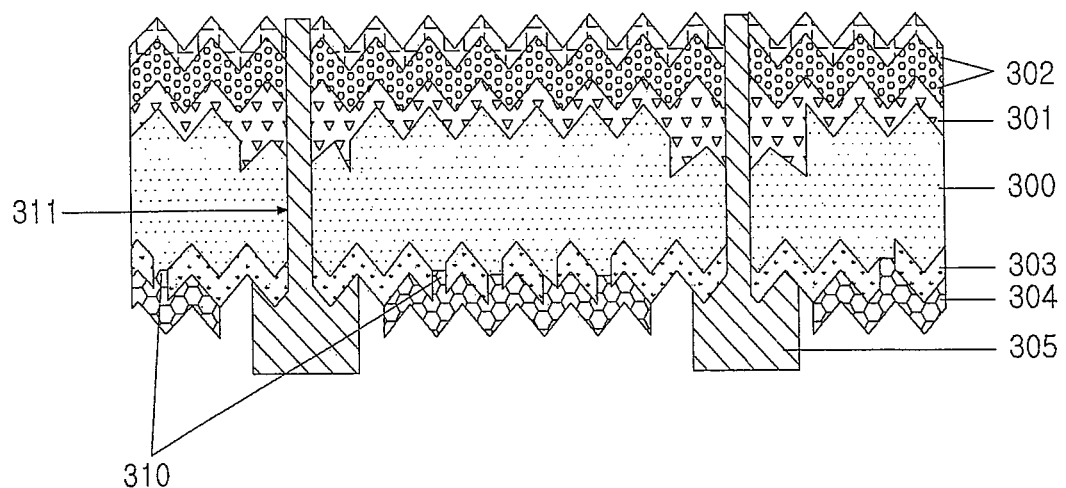
FIG. 1 is a cross-sectional view of a solar cell according to one embodiment of the present invention.

FIG. 1 is a cross-sectional view of a solar cell according to one embodiment of the present invention. Hereinafter, a structure of the solar cell of the present invention will be described with reference to FIG. 1.

The solar cell of the present invention comprises a semiconductor substrate 300, an emitter layer 301 that is formed on a front surface (a light incident surface or an upper surface) and a side surface of the semiconductor substrate, or the front surface, the side surface, and a rear surface (a back surface or a lower surface) of the semiconductor substrate, a passivation layer 303 that is formed on the rear surface of the semiconductor substrate, at least one localized back surface field (BSF) layer 304 that is formed at a predetermined portion on the passivation layer and connected with the semiconductor substrate, and a metal electrode 305 that penetrates through the front surface and rear surface of the semiconductor substrate.

The front surface of the semiconductor substrate 300 may be textured in order to reduce reflection of incident light. The texturing of the front surface of the semiconductor substrate may be performed by a wet chemical etch process, a reactive ion etching (RIE) process, a dry chemical etch process, or a laser irradiation process, etc. The texturing of a surface, for example the front surface, may form unevenness on the surface.

Further, the rear surface of the semiconductor substrate 300 may be planarized to reduce internal reflection and may be textured according to one embodiment of the present invention. The planarization of the rear surface of the semiconductor substrate may be performed by the wet chemical etch process, the reactive ion etching (RIE) process, and the dry chemical etch process.

At least one antireflection film layer 302 may be further provided on the upper surface of the emitter layer 301. For example, the antireflection film 302 may be formed using a multi layer, for example, two layers such as SiNx/SiOxNy or SiNx/SiOx or three layers such as SiOx/SiNx/SiOx, and the like. The antireflection film layer 302 performs a function of minimizing the reflectivity of the solar cell as well as a function of a passivation layer.

As the semiconductor substrate 300, a p-type dopant semiconductor substrate or an n-type dopant semiconductor substrate can be used.

The emitter layer 301 may include dopant having a type opposite to that of the semiconductor substrate. Therefore, an n-type emitter layer may be formed on the p-type dopant semiconductor substrate and a p-type emitter layer may be formed on the n-type dopant semiconductor substrate to form a p-n junction.

The rear surface passivation layer 303 may have a plurality of contact holes 310. The rear surface passivation layer 303 stabilizes and protects the surface of the substrate and minimizes the surface recombination of electrons and holes to reduce the rear surface recombination velocity of electrons and holes (BSRV) to below 500 cm/sec and to perform a role of increasing the efficiency of the solar cell. The contact hole 310 can connect the electrodes of the solar cell by contacting the p-type dopant semiconductor substrate 300 to the local BSF layer.

The passivation layer 303 may be a thermal oxide, such as silicon oxide ($SiO_2$), etc., formed by a rapid thermal oxidation (RTO) method that is performed inside a furnace for a rapid thermal process (RTP). In addition to the method, the passivation layer 303 may be formed by sputtering using $SiO_2$ as a target material. The passivation layer can also use materials, such as $SiO_2$, SiNx, SiOxNy that are formed by a plasma enhanced chemical vapor deposition (PECVD) method.

In one embodiment of the present invention, one passivation layer 303 is formed, but a plurality of passivation layers formed of a multi layer can also be formed.

Figure 2:
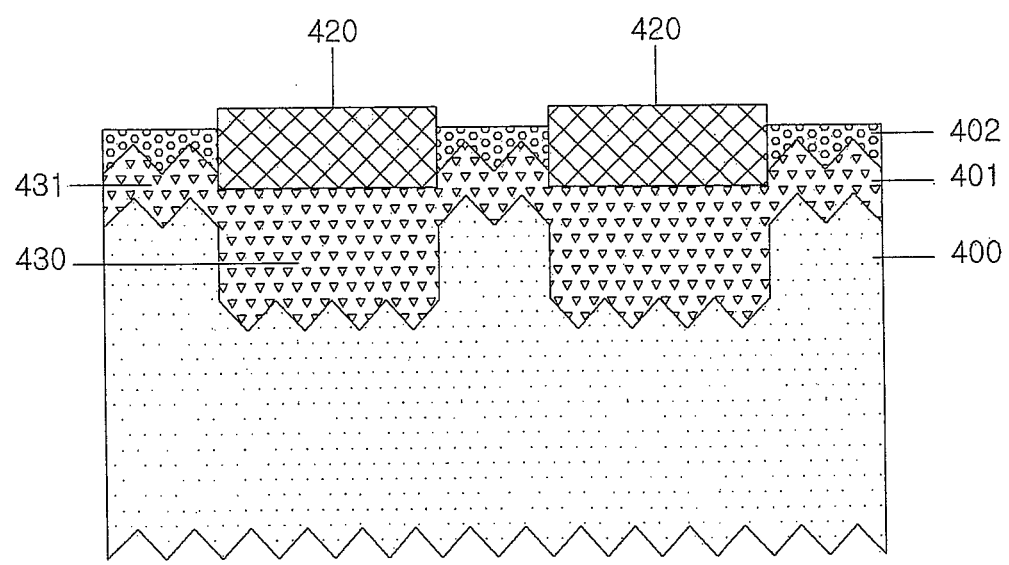
FIG. 2 is a side view of a solar cell according to one embodiment of the present invention.

FIG. 2 is a side view of a solar cell according to one embodiment of the present invention. Referring to FIG. 2, a finger part 420, that is positioned on an upper portion of the metal electrode 305 and is formed on the front surface of the semiconductor substrate 400, can be connected with an emitter layer 401. An antireflection film 402 may be further provided on the upper surface of the emitter layer 401.

In addition, the emitter layer 401, which is a region adjacent to the metal electrode 305, may be configured to include a first region 430 doped with a semiconductor dopant of a high-concentration and a second region 431 doped with the semiconductor dopant having a concentration lower than that of the first region 430.

The passivation layer, the back surface field layer, and the metal electrode, etc., included at the rear in the solar cell according to one embodiment of the present invention are not shown in FIG. 2, for brevity.

The structure of the solar cell according to the present invention was described with reference to FIGS. 1 and 2, but a method of fabricating the solar cell will be described below. However, the following fabrication method of a solar cell is provided to help a general understanding. As a result, the present invention is not limited to the following embodiment and those skilled in the art can modify and change the present invention in various forms from the specification.

One embodiment of the fabrication method of a solar cell according to the present invention may comprise the steps of forming a penetration groove (or a penetrating hole) that penetrates through the front surface and rear surface of the semiconductor substrate (or penetrates through the semiconductor substrate from the front surface to the rear surface), texturing the front surface of the semiconductor substrate to reduce the reflection of incident light, forming the emitter layer on the upper portion of the front surface of the semiconductor substrate, planarizing the rear surface of the semiconductor substrate to reduce internal reflection, forming the passivation layer having the plurality of contact holes on the upper portion of the rear surface of the semiconductor substrate, forming the metal electrode on the front surface and rear surface of the semiconductor substrate, forming the patterned rear electrode on the contact hole region, forming the localized back surface field (BSF) layer in an region where the rear electrode contacts the semiconductor substrate by firing the metal electrode and the rear electrode, and performing edge isolation, for example, by using a laser.

Hereinafter, each step will be described in detail. First, the semiconductor substrate 300 is prepared. The semiconductor substrate may be a p-type dopant semiconductor substrate or an n-type dopant semiconductor substrate and the present embodiment uses the p-type dopant semiconductor substrate 300.

Next, the penetration groove 311 that penetrates through the front surface and rear surface of the semiconductor substrate 300 is formed. The penetration groove 311 may be formed to penetrate through the substrate by way of laser drilling. Various laser light sources can be used. As one example, a green laser source and an Nd/YAG laser source can be used. The width of the penetration groove 311 is etched by laser so that it becomes 100 μm or less. The solar cell of the present invention does not need to form tens of hundreds holes unlike the emitter wrap through (EWT) structure, such that there is almost no risk of causing a problem of breakage of the substrate.

Next, the p-type dopant semiconductor substrate 300 may be textured by a wet chemical etch process, a reactive ion etch process, or a laser irradiation process. When the texturing is performed by the reactive ion etching method, only the front surface of the semiconductor substrate 300 may be etched. The texturing structure (or a textured structure) in a pyramidal form according to the present embodiment randomly reflects sunlight incident to a solar cell, such that light can be maximally absorbed into the solar cell. Thereby, the efficiency of the solar cell can be increased.

Next, the emitter layer is formed on the front surface, side surface, and rear surface of the textured semiconductor substrate 300. In the present embodiment, the n-type emitter layer is formed on the p-type dopant semiconductor substrate 300. The emitter layer can be formed by a thermal diffusion method, or phosphorous oxychloride ($POCl_3$) diffusion method.

Thereafter, at least one antireflection film layer 302 is formed on the upper surface of the emitter layer that is formed on the front surface and side surface of the textured semiconductor substrate 300. As described above, the antireflection film layer 302 performs a function of minimizing the reflection of the solar cell as well as a function of the passivation layer.

Then, the emitter layer, that is, an n+ layer, which is formed on the rear surface of the semiconductor substrate 300, is removed by etching, so that the emitter layer 301 is formed only on the front surface and side surface of the semiconductor substrate 300.

Next, the passivation layer 303 is formed on the rear surface of the semiconductor substrate 300 having the etched n+ layer by the plasma enhanced chemical vapor deposition (PECVD) method.

Next, the metal electrode is formed on the front surface and rear surface of the semiconductor substrate. In order to form the metal electrode, the paste for the metal electrode should be screen-printed and dried on the front surface of the semiconductor substrate, and the paste for the metal electrode should be also screen-printed and dried on the rear surface of the semiconductor substrate, either simultaneously or separately. As the paste for the metal electrode, Ag paste is mainly used. The paste for the metal electrode should be patterned and printed on the upper portion and lower portion of the penetration groove 311 of the semiconductor substrate, respectively. The metal electrode is finally completed while the metal electrode is filled inside the penetration groove by the heat-treating and firing process in the subsequent process.

Therefore, since the metal electrode of the upper side is formed in a fine finger line according to one embodiment, the width of the metal electrode of the upper side can be relatively narrower than the width of the metal electrode of the lower side. The width of the penetration groove 311 may equal to the finger line width of the metal electrode exposed to the front surface portion of the semiconductor substrate, which may be formed in a width of 50 μm to 100 μm. In this case, the width of the metal electrode exposed to the rear surface portion of the semiconductor substrate may exceed at least 100 μm Then, the contact hole 310 is formed by removing a portion of the passivation layer 303 using the etching paste. The contact hole 310 is formed so that the passivation layer 303 contacts the rear surface of the semiconductor substrate 300. As such, the back surface field layer contacts the semiconductor substrate only in an region where the contact hole 310 is formed so that the recombination of electrons and holes occurring at the contact portion is considerably reduced or prevented, making it possible to increase the efficiency of the solar cell.

Thereafter, the paste for the rear electrode is screen-printed and dried in the region other than the paste region for the metal electrode that is screen-printed on the upper surface of the passivation layer formed with the contact hole 310. As the paste for the rear electrode, Al paste or AgAl paste is used.

Next, the rear electrode is fired on the rear surface by the firing process to form the localized back surface field layer 304 and at the same time, the paste for the metal electrode printed on the front surface and the rear surface of the semiconductor substrate is fired, such that the metal electrode 305 penetrating through the front surface and rear surface of the semiconductor substrate is formed by being connected within the penetration groove 311. The heat treating temperature of the firing process may have a high temperature of 700° C. to 1200° C.

Figure 3:
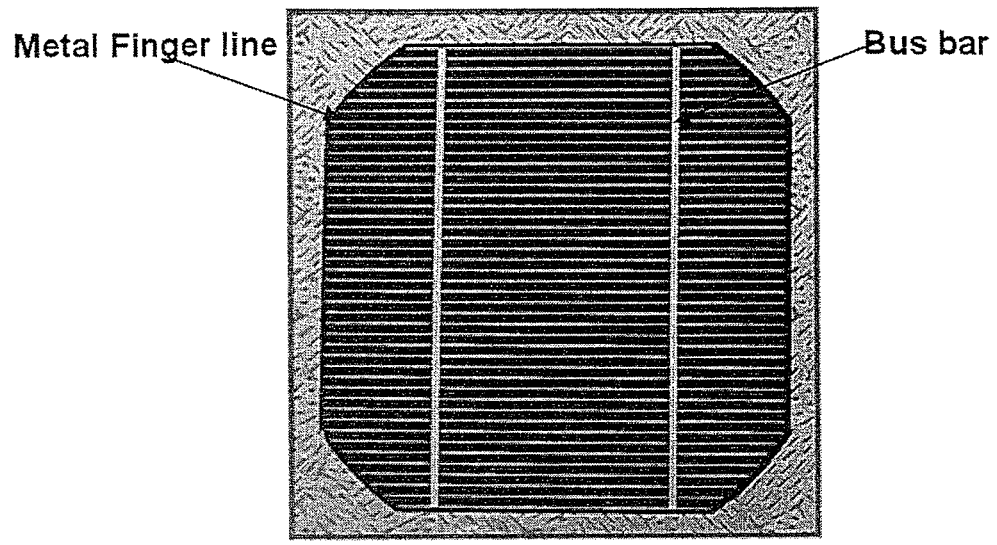
FIG. 3 shows a top view of a silicon solar cell according to a related art.
Figure 4:
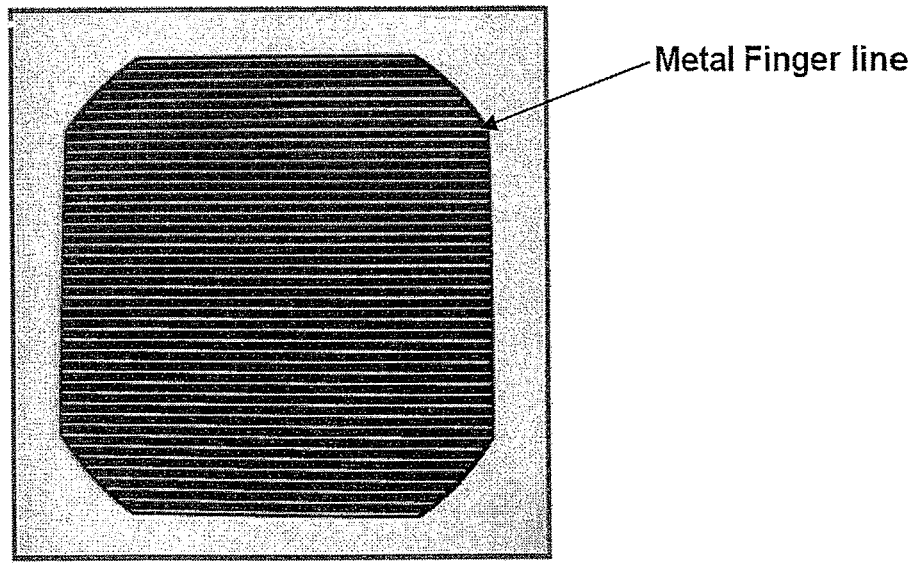
FIG. 4 shows a top view of a silicon solar cell according to the present invention.

FIGS. 3 and 4 are top views showing the solar cell having a structure of the metal wrap through (MWT) form. Instead of the structure where a bus bar electrode is formed on the front surface of the silicon solar cell (see FIG. 3) according to the related art, only the metal finger line remains on the front surface of the solar cell (see FIG. 4) of the present invention, making it possible to considerably prevent the efficiency of the solar cell from being reduced due to shadowing. In embodiments of the present invention, a bus bar or a bus bar electrode corresponding to a finder part or a finger electrode is formed in the rear surface of the semiconductor substrate.

Next, if an edge isolation is performed using laser and the inter-electrode isolation is performed, the solar cell of the present invention is completed. The edge isolation may be performed on various portions of the solar cell, for example, between the BSF layer 304 and the metal electrode 305, especially the bus bar.

Hereinafter, a fabrication method of a solar cell according to another embodiment of the present invention will be described below. The fabrication method of the solar cell according to this embodiment of the present invention may comprise the steps of forming a penetration groove (or a penetrating hole) that penetrates through the front surface and rear surface of the semiconductor substrate (or penetrates through the semiconductor substrate from the front surface to the rear surface), texturing the front surface of the semiconductor substrate to reduce the reflection of incident light, forming the emitter layer on the upper portion of the front surface and side surface of the semiconductor substrate, planarizing the rear surface of the semiconductor substrate to reduce internal reflection, forming the passivation layer without the contact holes on the upper portion of the rear surface of the semiconductor substrate, forming the metal electrode on the front surface and rear surface of the semiconductor substrate, patterning the rear electrode for the local contact on the passivation layer, forming the localized back surface field (BSF) layer in the region where the rear electrode contacts the semiconductor substrate by firing the metal electrode and the rear electrode, and performing edge isolation, for example, using a laser.

First, the p-type dopant semiconductor substrate 300 is prepared and then, the penetration groove 311 that penetrates through the front surface and rear surface of the semiconductor substrate 300 is formed by laser drilling. Next, the p-type dopant semiconductor substrate 300 is textured and the n+ type emitter layer is formed on the front surface and the rear surface of the textured semiconductor substrate 300.

Next, at least one antireflection film layer 302 is formed on the emitter layer formed on the front surface of the textured semiconductor substrate 300 and then, the n+ emitter layer formed on the rear surface of the semiconductor substrate 300 is removed by etching, so that the emitter layer 301 is formed only in the front surface of the semiconductor substrate 300. Next, the passivation layer 303 is formed on the rear surface of the semiconductor substrate 300 having the etched n+ layer by the plasma enhanced chemical vapor deposition (PECVD) method.

Next, screen printing the paste for the metal electrode is performed, which is the same as solar cell of the foregoing embodiment.

Next, the paste for the rear electrode such as an Al paste or an AgAl paste is screen-printed and dried in the region other than the region of the paste for the metal electrode that is screen-printed on the upper surface of the passivation layer. Thereafter, laser is irradiated on some region of the paste for the rear electrode. As a result, the contact hole 310, which a portion of the region of the paste for the rear electrode is connected with the rear surface of the semiconductor substrates, is formed.

Next, the paste for the metal electrode formed on the front surface and rear surface of the semiconductor substrate is fired by the firing processing so that the metal electrode 305 is completed by being connected within the penetration groove 311, and the patterned rear electrode and the localized back surface field (BSF) layer 304 are formed on the rear surface of the semiconductor substrate.

Next, if the edge isolation is performed using laser and the inter-electrode isolation is performed, the solar cell of the present invention is completed.

What is claimed is:

1. A solar cell, comprising:
   a semiconductor substrate including at least one penetration groove that penetrates through the semiconductor substrate;
   an emitter layer that is formed on a front surface and a side surface of the semiconductor substrate;
   at least one passivation layer that is formed on a rear surface of the semiconductor substrate;
   a rear electrode that is formed on the passivation layer and locally contacts the semiconductor substrate; and
   a metal electrode including,
      a finger part that is formed on the front surface of the semiconductor substrate,
      a bus bar that is formed on the passivation layer that is formed on the rear surface of the semiconductor substrate, and
      a penetration part that connects the finger part and the bus bar, and formed in the penetration groove,
   wherein the finger part, the bus bar and the penetration part are electrically connected to the emitter,
   the bus bar of the metal electrode and the rear electrode are separately located on the rear surface of the semiconductor substrate,
   the emitter layer is a selective emitter layer that includes a first region doped with a first concentration of a semiconductor dopant and a second region doped with a second concentration of the semiconductor dopant that is less than the first concentration of the first region,
   the first region is adjacent to the finger part on the front surface of the semiconductor substrate, and
   the at least one penetration groove further penetrates through the first region.

2. The solar cell according to claim 1, further comprising a back surface field layer at a contact surface of the rear electrode and the semiconductor substrate,
   wherein the semiconductor substrate is a p-type dopant semiconductor substrate, the emitter layer is an n-type dopant layer, and the at least one back surface field layer is a p+ type dopant layer doped with a higher concentration of the p-type dopant than a concentration of the p-type dopant of the p-type dopant semiconductor substrate.

3. The solar cell according to claim 1, wherein a width of the finger part is narrower than a width of the penetration part or the bus bar.

4. The solar cell according to claim 1, wherein a width of the bus bar is wider than a width of the penetration part.

5. The solar cell according to claim 1, wherein a width of the penetrating part is 50 µm to 100 µm.

6. The solar cell according to claim 1, wherein the emitter layer is further formed on the rear surface of the semiconductor substrate.

7. The solar cell according to claim 1, wherein a thickness of the first region is greater than a thickness of the second region.

8. The solar cell according to claim 1, further comprising a back surface field layer at a contact surface of the rear electrode and the semiconductor substrate,
   wherein the at least one back surface field layer is selectively formed at a portion of the rear electrode that contacts the semiconductor substrate through a contact hole of the passivation layer.

9. The solar cell according to claim 1, further comprising at least one antireflection film that is formed on an upper surface of the emitter layer.

10. The solar cell according to claim 1, wherein the front surface of the semiconductor substrate, or the front surface and the rear surface of the semiconductor substrate have a textured structure.

11. A fabrication method of a silicon solar cell, the method comprising:
    forming at least one penetration groove that penetrates through a semiconductor substrate;

forming an emitter layer having a polarity different from a polarity of the semiconductor substrate on the semiconductor substrate;

forming at least one passivation layer on a rear surface of the semiconductor substrate;

forming a metal electrode in the at least one penetration groove through the semiconductor substrate from a front surface of the semiconductor substrate to the rear surface thereof via the at least one penetration groove, wherein the metal electrode includes a finger part that is formed on the front surface of the semiconductor substrate and is connected to the emitter layer, a bus bar that is formed on the passivation layer that is formed on the rear surface of the semiconductor substrate, and a penetration part that connects the finger part and the bus bar, formed in the penetration groove, and penetrates through the semiconductor substrate and the passivation layer; and forming a rear electrode that locally contacts the semiconductor substrate through the passivation layer and is formed at the rear surface of the semiconductor substrate, wherein the bus bar of the metal electrode and the rear electrode are separately located on the rear surface of the semiconductor substrate, the emitter layer is a selective emitter layer that includes a first region doped with a first concentration of a semiconductor dopant and a second region doped with a second concentration of the semiconductor dopant that is less than the first concentration of the first region, the first region is adjacent to the finger part on the front surface of the semiconductor substrate, and the at least one penetration groove further penetrates through the first region.

12. The fabrication method according to claim 11, further comprising locally forming a back surface field layer at a contact surface of the rear electrode and the semiconductor substrate.

13. The fabrication method according to claim 11, further comprising texturing the front surface of the semiconductor substrate or the front surface and the rear surface of the semiconductor substrate before and after forming the at least one penetration groove.

14. The fabrication method according to claim 11, wherein the forming of the metal electrode and the forming of the rear electrode are performed at the same time.

15. The fabrication method according to claim 14, wherein the metal electrode is formed by applying and heat treating a silver (Ag) paste in the at least one penetration groove of the semiconductor substrate.

16. The fabrication method according to claim 14, wherein the rear electrode is formed by applying and heat treating an aluminum (Al) paste or an aluminum silver (AgAl) paste.

17. The fabrication method according to claim 11, wherein the forming of the emitter comprises:
  patterning a film on the front surface of the semiconductor substrate including the at least one penetration groove; and
  forming the first region by thermal diffusion of a dopant having a conductive type opposite to a semiconductor dopant of the semiconductor substrate, and the second region corresponding to locally penetrated portions of the patterned film and being doped with the dopant having the conductive type opposite to a semiconductor dopant of the semiconductor substrate.

18. The fabrication method according to claim 11, further comprising forming at least one antireflection film on an upper portion of the emitter layer.

19. The fabrication method according to claim 11, wherein the forming of the passivation layer includes forming at least one film composed of at least one material selected from a group consisting of silicon oxide ($SiO_2$), silicon nitride (SiNx), and silicon oxinitride (SiOxNy) by any one of a chemical vapor deposition (CVD) method, a plasma enhanced chemical vapor deposition (PECVD) method, a printing method, and a spray method; and
  generating at least one contact hole by removing a portion of the at least one film by a chemical etching method or a mechanical etching method, or by irradiating portions of the passivation layer through the rear electrode.

* * * * *